United States Patent
Aspar et al.

(10) Patent No.: US 6,303,468 B1
(45) Date of Patent: Oct. 16, 2001

(54) METHOD FOR MAKING A THIN FILM OF SOLID MATERIAL

(75) Inventors: Bernard Aspar, Rives; Michel Bruel, Veurey, both of (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 09/463,976

(22) PCT Filed: Aug. 11, 1998

(86) PCT No.: PCT/FR98/01789

§ 371 Date: Feb. 14, 2000

§ 102(e) Date: Feb. 14, 2000

(87) PCT Pub. No.: WO99/08316

PCT Pub. Date: Feb. 18, 1999

(30) Foreign Application Priority Data

Aug. 12, 1997 (FR) .................................. 97 10288

(51) Int. Cl.⁷ ............................. H01L 21/30; H01L 21/46
(52) U.S. Cl. ......................... 438/455; 438/458; 438/515; 438/526; 438/766; 438/798; 148/DIG. 12; 156/250
(58) Field of Search ................................ 438/455, 515, 438/526, 407, 458, 766, 798; 148/DIG. 12; 156/250

(56) References Cited

U.S. PATENT DOCUMENTS

| | | | |
|---|---|---|---|
| 5,374,564 | * 12/1994 | Bruel | 438/455 |
| 5,494,835 | 2/1996 | Bruel | 438/53 |
| 5,559,043 | 9/1996 | Bruel | 438/407 |
| 5,985,688 | 11/1999 | Bruel | 156/250 |
| 5,985,742 | * 11/1999 | Henley et al. | 438/515 |
| 5,994,207 | * 11/1999 | Henley et al. | 438/515 |
| 6,010,579 | * 1/2000 | Henley et al. | 148/33.2 |
| 6,013,563 | * 1/2000 | Henley et al. | 438/458 |
| 6,013,567 | * 1/2000 | Henley et al. | 438/515 |
| 6,033,974 | * 3/2000 | Henley et al. | 438/526 |
| 6,146,979 | * 11/2000 | Henley et al. | 438/458 |

FOREIGN PATENT DOCUMENTS

| | | |
|---|---|---|
| 0 786 801 A | 7/1997 | (EP) . |
| 2 681 472 A | 3/1993 | (FR) . |

* cited by examiner

Primary Examiner—Charles Bowers
Assistant Examiner—Asok Kumar Sarkar
(74) Attorney, Agent, or Firm—Oblon, Spivak, McClelland, Maier & Neustadt, P.C.

(57) ABSTRACT

The invention relates to a method of manufacturing a thin film of solid material comprising at least the following steps:

a step of ionic implantation through one face of a substrate of said solid materials using ions capable of creating in the volume of the substrate and at a depth close to the mean depth of penetration of the ions, a layer of micro-cavities or micro-bubbles, this step being carried out at a particular temperature and for a particular length of time, an annealing step intended to bring the layer of micro-cavities or micro-bubbles to a particular temperature and for a particular length of time with the intention of obtaining cleavage of the substrate on both sides of the layer of micro-cavities or micro-bubbles.

The annealing step is carried out to a thermal budget made in relation to the thermal budget of the ionic implantation step and possibly other thermal budgets inferred for other steps, in order to provide said cleavage of the substrate.

19 Claims, No Drawings

US 6,303,468 B1

METHOD FOR MAKING A THIN FILM OF SOLID MATERIAL

TECHNOLOGICAL FIELD

The invention relates to a method of manufacturing a thin film of solid material. This method, in particular, allows the transfer of a thin film of homogeneous or heterogeneous solid onto a support made up of a solid material of the same kind or of a different kind.

STATE OF THE PRIOR TECHNOLOGY

Document FR-A-2 681 472 describes a method of manufacturing thin films of semiconductor material. This document discloses that the implantation of a rare gas or hydrogen into a substrate made of semiconductor material is able to cause the formation of micro-cavities or micro-bubbles (sometimes given the name "platelets") at a depth close to the mean depth of penetration of the implanted ions. If this substrate is brought into intimate contact, through its implanted surface with a stiffener and a heat treatment is applied at sufficient temperature, it causes an interaction between the micro-cavities or micro-bubbles leading to a separation of the semiconductor substrate into two parts: a thin semiconductor film adhering to the stiffener on the one hand, and the remainder of the semiconductor substrate on the other hand. The separation takes place at the place where the micro-cavities or micro-bubbles are present. The heat treatment is such that interaction between the micro-bubbles or micro-cavities created by implantation induces a separation between the thin film and the rest of the substrate. Therefore there is transfer of a thin film from an initial substrate to a stiffener being used as a support for this thin film.

This method can also be applied to the manufacture of a thin film of solid material other than a semiconductor material (a conductive or dielectric material) whether crystalline or not.

If the thin film defined in the substrate is sufficiently rigid by itself (because of its thickness or because of its mechanical properties) a self-supporting film can be obtained after the transfer annealing. This is what document FR-A-2 738 671 discloses.

Contrary to this, in the absence of a stiffener, if the film is too thin to induce the fracture over the whole width of the substrate, bubbles appear at the surface conveying the presence of micro-fissures at the level of the mean depth of implantation of the ions. In this case, the heat treatment does not produce self-supporting layers but only produces flakes.

In the document FR-A-2 681 472, the heat treatment is defined by the annealing temperature in a step subsequent to the implantation step. This annealing temperature is greater than the implantation temperature and has to be such that it causes the separation between the thin film and the rest of the substrate.

The documents quoted above specify that the heat treatment is carried out at a temperature greater than the implantation temperature. Document FR-A-2 681 472 indicates that, in the case of a substrate made of silicon, the implantation temperature is preferably between 20° C. and 450° C. and that for the annealing, a higher temperature is necessary (for example a temperature of 500° C.

However, in certain cases and for certain applications, a high heat treatment temperature can present disadvantages. In effect, it can be advantageous to obtain cleavage of the substrate at temperatures considered to be low, in particular at temperatures lower than the temperature of implantation. This is important notably in the case where the transfer brings together materials with different thermal coefficients of expansion.

It can be advantageous to carry out the ionic implantation step at a high temperature, a temperature which can be higher than the temperature used for the heat treatment step. The interest in this resides in the fact that, if there is no restriction on the implantation temperature, a high implantation current density can be provided without being obliged to cool the substrate. The duration of the implantation can then be very much reduced.

In addition, between the ionic implantation step and the heat treatment (or annealing) step bringing about cleavage, the implanted surface can be treated, for example with the intention of creating electronic circuits in the case of a substrate made of semiconductor material. These intermediate treatments can be adversely affected if the annealing temperature is too high.

DESCRIPTION OF THE INVENTION

The invention allows the problems of the prior art to be resolved. The inventors of this invention have, in effect, discovered that it is possible to reduce the annealing temperature if one takes into account a thermal budget of the heat supplied to the substrate during the course of various steps of the method (ionic implantation step, possibly the adhesion of the substrate to the stiffener, possibly intermediate treatments and the annealing step that permits the separation). By thermal budget, it is understood that for a step where heat is supplied (for example, during the annealing step), one must not be concerned only with the temperature but with the combination of time and temperature when heat is supplied to the substrate.

By way of example, for a substrate made of silicon and weakly doped, implanted with a dose of $5.5 \times 10^{16}$ ions $H^+/cm^2$ of energy 69 keV, at a temperature of 80° C. for around 5 minutes, cleavage appears with a thermal budget, in the case of an isothermal annealing, which depends as has been seen on the time-temperature combination. This thermal budget is 2 hours 15 minutes at 450° C. If the implanted dose is greater, for example, for a substrate made of weakly doped silicon implanted with a dose of $10^{17}$ ions $H^+/cm^2$ of energy 69 keV at a temperature of 80° C. for 5 minutes, the thermal budget necessary to obtain cleavage is less than previously. This budget is, for example, 2 minutes 22 seconds at 450° C. or 1 hour 29 minutes at 300° C. Hence cleavage occurs for thermal budgets, in the case of an isothermal annealing, which are different to the previous cases but which still depend on the time-temperature combination. The choice of thermal budgets can also depend on the type of material and its doping level when it is doped.

By way of example, for a strongly doped silicon (for example $10^{20}$ boron/$cm^3$) which is implanted with a dose of $5.5 \times 10^{16}$ ions $H^+/cm^2$ of energy 69 keV at a temperature of 80° C. for 5 minutes, cleavage is obtained for a thermal budget of 4 minutes 15 seconds at 300° C. or 1 hour 43 minutes at 225° C.

In the case where the thermal treatment is carried out with a progressive rise in temperature, the thermal budget applied to substrates during this rise in temperature must be taken into account since it contributes to the cleavage.

In a general way, The choice of the thermal budget to be used in order to obtain fracture depends on the whole group of thermal budgets applied to the basic material or to the structure starting with the implantation step. All these thermal budgets constitute a thermal balance sheet which allows cleavage of the structure to be achieved. This thermal balance sheet is formed by at least two thermal budgets: that of the implantation and that of the annealing.

It may include, depending on the application, other types of budgets for example: a thermal budget to reinforce the molecular bonds at the adhesion interface or to create these bonds and one or more thermal budgets for the production of active elements.

Hence an objective of the invention is a method of manufacturing a thin film of solid material that includes at least the following steps:

a step of ionic implantation through one face of a substrate of said solid materials using ions capable of creating in the volume of the substrate and at a depth close to the mean depth of penetration of the ions, a layer of micro-cavities or micro-bubbles, this step being carried out at a particular temperature and for a particular length of time, an annealing step intended to bring the layer of micro-cavities or micro-bubbles to a particular temperature and for a particular length of time with the intention of obtaining cleavage of the substrate on both sides of the layer of micro-cavities or micro-bubbles characterised in that the annealing step is carried out with a thermal budget made in relation to the thermal budget of the ionic implantation step and the dose and the energy of the implanted ions and possibly other thermal budgets inferred by other steps in order to obtain cleavage of the substrate.

The term cleavage is defined in the broad sense, that is to say to mean any type of fracture.

The method according to the invention allows the production of a thin film of solid material, crystalline or non-crystalline, which can be a conductive material, a semi-conductor material or a dielectric material. The substrate of the solid material can be in the form of a layer. The thermal budget made for the annealing step can also take account of implantation step parameters such as the dose of implanted ions and the energy.

The ions likely to be implanted are advantageously rare gas ions or hydrogen ions. The direction of implantation of the ions can be normal to the surface of the substrate or slightly inclined.

By hydrogen one understands gaseous species either in their atomic form (for example H) or in their molecular form (for example $H_2$) or in their ionic form ($H^+$, $H_2^+$, ...) or in their isotopic form (deuterium) or isotopic and ionic, ...

The thermal budget for the annealing step can also be made in order to obtain said cleavage of the substrate either naturally or with the help of stresses applied to the substrate.

The thermal budget of the annealing step can include at least one rapid rise in temperature and/or at least one rapid fall in temperature. These rapid changes in temperature occur at the rate of from a few degrees per minute to a few tens of degrees or indeed a few hundreds of degrees per second (annealing treatments of the Rapid Thermal Annealing (RTA) type). These annealing treatments can offer an advantage for certain implantation conditions since they facilitate the step of formation (or nucleation) of the micro-cavities.

The thermal budget of the annealing step can also be zero, the cleavage of the substrate being obtained through the use of mechanical and/or thermal stress. In effect, the thermal budget being a function of the temperature applied and the duration of the application, the thermal budget for the annealing step can have a temperature which varies, for example, from 0° C. to more than 1000° C. and can have a duration which varies from 0 seconds to several hours. Hence if the thermal budgets that precede the annealing step are carried out with high temperatures and/or for long durations and if the doses and the energy of the implanted ions are high (for example for silicon, some $10^{17}$ $H^+/cm^2$ with an energy of 100 keV), the thermal annealing budget can even be zero both with regard to duration and temperature. Simple stresses will then allow cleavage to occur. These stresses are, for example, of the mechanical kind (for example shearing forces and/or tensile forces) or of the thermal kind (for example through cooling the structure).

The method can include, in addition, a step of fixing the implanted surface of the substrate onto a support. The fixing of the implanted surface of the substrate onto the support can be done by using an adhesive substance. The fixing step may include a heat treatment.

The annealing step can be carried out by pulsed heating.

The method according to this invention is applicable in particular to the manufacture of a thin film of monocrystalline silicon. In this case, before cleavage of the substrate occurs, all or part of at least one active element can be created in the part of the substrate intended to form the thin film. If said surface of the substrate is masked before the ionic implantation step, the mask is such that the ionic implantation step is capable of creating zones of micro-cavities or micro-bubbles sufficiently close to one another for one to be able to obtain said cleavage.

The method according to this invention is equally well applicable to the production of a thin film starting from a substrate, said surface of which is patterned.

It may also be applied to the production of a thin film from a substrate that includes layers of different chemical kinds.

It is also applicable to the production of a thin film from a substrate that includes at least one layer obtained by growth. This growth can be obtained by epitaxy, it being possible for the fracture to take place in the epitaxiated layer or on the other side of the epitaxiated layer or at the interface.

The invention will be better understood on reading the description which will follow given by way of a non-limitative example.

DETAILED DESCRIPTION OF EMBODIMENTS OF THE INVENTION

A first embodiment of the invention carries out the implantation step at a relatively high temperature.

So as to improve the productivity of the equipment and in particular the implantation devices, it would appear interesting to use machines supplying a high current density. For example, currents of 4 mA over a surface area of 100 cm$^2$ that would allow doses of $5\times10^{16}$ ions $H^+/cm^2$ in 200 seconds or around 3 minutes to be obtained. If this implantation is carried out at 50 keV (which gives a mean depth of the order of 500 nm) power of the order of 2 W/cm$^2$ is obtained, which in the case of silicon and for a normal implantation device without cooling leads to temperatures of the order of 470° C.

To summarise in this case, the dose required for the implantation has been obtained for an implantation at a temperature of the order of 470° C. and a time of the order of 3 minutes.

If a stiffener is applied to this substrate and an annealing heat treatment of around 1 hour at 450° C. is carried out on this structure, the thermal budget of the heat treatment is such that the micro-cavities can interact with one another and lead to the fracture. Hence the transfer of the thin film from the silicon onto its stiffener will be obtained.

This example well demonstrates that if certain precautions are taken with regard to the thermal budgets applied to the substrate in the course of the implantation and the heat treatment, it is possible to obtain the cleavage at a temperature lower than the implantation temperature.

In conclusion, the invention consists of carrying out a heat treatment with a minimum thermal budget and one that leads to cleavage. This minimum thermal budget must take into account all of the budgets and notably the thermal budget provided by the implantation, at an implantation temperature for a period of time, and the thermal budget provided by the annealing, at an annealing temperature for a period of time. In other words, the present invention involves selecting a thermal budget of the annealing step so that the thermal budget for the annealing step is greater than or equal to a minimum total thermal budget necessary to obtain cleavage of the substrate along the layer of micro-cavities or micro-bubbles less a thermal budget for the step of ionic implantation less the sum of any thermal budgets inferred by steps other than the step of ionic implantation and the annealing step.

A second embodiment of the invention is applicable to the transfer of materials having thermal coefficients of expansion different to those of their supports. This is the case of hetero-structures.

In the case of a transfer of silicon onto pure silica, the stiffener has a thermal coefficient of expansion different to that of the semiconductor material. The thermal budgets that allow the transfer of mono-crystalline silicon in the case of lightly doped silicon are of the order of a few hours (6 hours) at 450° C. At this temperature, a parting from the substrate and from the support (stiffener) brought into intimate contact occurs during the annealing. This parting occurs at the interface where they were brought into contact and not at the layer where the micro-cavities or micro-bubbles are located. Contrary to this, if the thickness of the support made of silica is sufficiently small (for example 400 $\mu$m), the assembly does not part up to 250° C. In the case where the silicon is strongly doped (for example, a type p doping of $10^{20}$ atoms of boron/cm$^2$), the cleavage can be obtained for a thermal budget of 250° C. for 1 hour and for an implantation of hydrogen ions of a dose of the order of $5 \times 10^{16}$ H$^+$ions/cm$^2$. As has been said above, such doses can be obtained with times of the order of a few minutes in the case of an implantation temperature of about 470° C.

Also in this case, the cleavage is obtained at an annealing temperature lower than the implantation temperature.

It is well understood that this works in the case where the annealing temperature is greater than the implantation temperature.

What is claimed is:

1. A method of manufacturing a thin film of solid material that includes at least the following steps:

a step of ionic implantation through one face of a substrate of the solid material using ions capable of creating in the volume of the substrate, and at a depth close to the mean depth of penetration of the ions, a layer of micro-cavities or micro-bubbles, this step being carried out at a maximum implantation temperature for a length of time;

an annealing step to bring the layer of micro-cavities or micro-bubbles to a maximum annealing temperature for a length of time; and a step of selecting a thermal budget of the annealing step so that the thermal budget for the annealing step is greater than or equal to a minimum total thermal budget necessary to obtain cleavage of the substrate along the layer of micro-cavities or micro-bubbles less a thermal budget for the step of ionic implantation less the sum of any thermal budgets inferred by steps other than the step of ionic implantation and the annealing step.

2. A method according to claim 1, wherein the thermal budget of the annealing step is selected in order to obtain the cleavage of the substrate either spontaneously, or subsequent to stresses being applied to the substrate.

3. A method according to claim 1, wherein the thermal budget of the annealing step includes at least one rapid rise in temperature and/or at least one rapid fall in temperature.

4. A method according to claim 1, wherein the thermal budget of the annealing step is zero, the cleavage of the substrate being obtained by the use of mechanical and/or thermal stresses.

5. A method according to claim 1, wherein it includes in addition, a step of fixing the implanted face of the substrate onto a support.

6. A method according to claim 5, wherein the fixing of the implanted face of the substrate onto the support is done by means of an adhesive substance.

7. A method according to claim 5, wherein the fixing step includes a heat treatment.

8. A method according to claim 5, wherein the fixing step is carried out by molecular adhesion.

9. A method according to claim 1, wherein the annealing step is carried out by pulsed heating.

10. The application of the method according to claim 1 to the production of a thin film of monocrystalline silicon.

11. Application according to claim 10, wherein, before obtaining the cleavage of the substrate, all or part of at least one active element is created in the part of the substrate intended to form the thin film.

12. Application according to claim 10, wherein, said face of the substrate being masked before the ionic implantation step, the mask is such that the ionic implantation step is capable of creating zones of micro-cavities or micro-bubbles sufficiently close to one another that said cleavage can be obtained.

13. Application of the method according to claim 10 to the production of a thin film starting from a substrate said face of which is patterned.

14. Application of the method according to claim 10 to the production of a thin film starting from a substrate that includes layers of different chemical kinds.

15. Application of the method according to claim 10 to the production of a thin film starting from a substrate that includes at least one layer obtained by growth.

16. Application according to claim 15, wherein said growth is obtained by epitaxy.

17. The method according to claim 1, wherein the thermal budget for the annealing step is equal to the minimum total thermal budget necessary to obtain cleavage of the substrate along the layer of micro-cavities or micro-bubbles less the thermal budget for the implantation step less the sum of any thermal budgets inferred by steps other than the step of ionic implantation and the annealing step.

18. The method according to claim 1, wherein the maximum annealing temperature is less than the maximum implantation temperature.

19. The method according to claim 1, wherein the maximum annealing temperature is less than or equal to 300° C.

* * * * *